(12) United States Patent
White et al.

(10) Patent No.: US 6,725,869 B2
(45) Date of Patent: Apr. 27, 2004

(54) PROTECTIVE BARRIER FOR CLEANING CHAMBER

(75) Inventors: John M. White, Hayward, CA (US); Alexander Lerner, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 12 days.

(21) Appl. No.: 09/816,807

(22) Filed: Mar. 23, 2001

(65) Prior Publication Data

US 2002/0134404 A1 Sep. 26, 2002

(51) Int. Cl.⁷ .................................................. B08B 3/12
(52) U.S. Cl. ....................... 134/147; 134/184; 134/902
(58) Field of Search ................................. 134/147, 184, 134/902, 1.3

(56) References Cited

U.S. PATENT DOCUMENTS

| | | | |
|---|---|---|---|
| 3,964,957 A | * | 6/1976 | Walsh .................... 134/902 X |
| 4,869,278 A | * | 9/1989 | Bran ...................... 134/902 X |
| 5,090,432 A | * | 2/1992 | Bran ...................... 134/184 X |
| 5,672,212 A | * | 9/1997 | Manos ................... 134/902 X |
| 5,828,012 A | | 10/1998 | Repolleet et al. |
| 6,119,708 A | * | 9/2000 | Fishkin et al. ......... 134/184 X |

FOREIGN PATENT DOCUMENTS

JP        8-158073        6/1996

* cited by examiner

Primary Examiner—Randy Gulakowski
Assistant Examiner—Joseph Perrin
(74) Attorney, Agent, or Firm—Dugan & Dugan

(57) ABSTRACT

A method and apparatus is provided that may protect a fragile component (such as a quartz plate) positioned within a megasonic tank from impact by falling objects. The megasonic tank may include a barrier (such as one or more extended rollers, quartz bars, or a net) that is configured to protect the fragile component.

10 Claims, 7 Drawing Sheets

US 6,725,869 B2

PROTECTIVE BARRIER FOR CLEANING CHAMBER

FIELD OF THE INVENTION

The present invention relates generally to an improved wafer cleaning system that employs megasonic energy to clean semiconductor wafers, compact discs, glass wafers, and the like. More specifically, the invention relates to methods and apparatuses configured to protect a fragile component (e.g., quartz, ceramic or sapphire plate, etc.) employed within a megasonic tank.

BACKGROUND OF THE INVENTION

Semiconductor wafers are often cleaned (individually or in a batch) within a tank of megasonically energized fluid. Such megasonic tanks may employ a plurality of rollers configured to support a wafer and further configured to rotate a wafer, a transducer coupled to the tank's fluid and configured to direct sonic energy through the fluid to the surfaces of a wafer supported therein. The chamber may further employ a window comprising a plate (e.g., a quartz, sapphire or ceramic plate) configured to cover the transducer such that the transducer(s) may be mounted outside the tank and may transmit energy through the plate to the tank fluid or, such that any transducers contained within the tank are sealed from the tank's fluid via the plate. Typically the plate and the transducers are positioned along the tank's bottom wall.

During tank assembly and/or during routine maintenance of the megasonic tank, a technician may be working in the tank with various hand tools while installing, replacing, or adjusting a component of the megasonic tank, such as the rollers, etc. While performing such manual tasks, the technician may accidentally drop a tool (e.g., a screwdriver). Unfortunately, when a hand tool is dropped into or within a megasonic tank, the hand tool may strike and break the plate that covers the transducer. Similarly, the plate may also be broken by falling wafers, which may be manually dropped or may fall, when automated wafer handlers are being calibrated or aligned, etc.

Accordingly, a method and apparatus is needed to reduce the occurrence of plate breakage.

SUMMARY OF THE INVENTION

The present invention provides a method and an apparatus that comprises a barrier configured to protect a fragile component from impact by falling objects. The method comprises providing a chamber configured to clean a substrate, and having a fragile component contained therein; and, above the fragile component, installing a barrier that extends over at least the width of the fragile component so as to protect the fragile component from impact by falling objects. The apparatus may comprise a tank configured to contain a liquid. The tank may have an opening configured to allow a substrate to enter the tank from a position above the tank; and may contain a fragile component (e.g., a transducer or a quartz, ceramic or sapphire plate) positioned within the footprint of the opening and configured to transmit sonic energy. The apparatus further comprises a barrier that extends above at least the width of the fragile component.

In one aspect, the inventive apparatus may comprise a megasonic tank having a fragile plate contained in (or forming a window in) the tank, and a barrier that covers at least portions of the width of the fragile plate, so as to protect the plate component from impact by falling objects.

In aspects wherein the barrier is positioned between a substrate supporting location and wherein the fragile component comprises a transducer or a fragile plate through which a transducer transmits energy to a substrate, the barrier thickness is chosen to be a multiple of one half the wavelength of the rate at which the sonic energy (e.g., the sound output by the transducer as the sonic energy) travels through the barrier material (or is otherwise chosen so as to be transparent to the acoustic energy output by the transducer).

Other features and aspects of the present invention will become more fully apparent from the following detailed description of the preferred embodiments, the appended claims and the accompanying drawings.

DETAILED DESCRIPTION OF THE PREFERRED EMBODIMENTS

An inventive megasonic tank is provided that may comprise a protective barrier that may reduce the occurrence of fragile component breakage as further described below. As used herein, fragile components are those which may crack, chip or break when an object such as a hand tool or a substrate impacts the component, for example after a free fall from a height at which substrates are conventionally transferred, or from other such working distances, etc. To fully understand the advantages of the inventive megasonic tank, a conventional megasonic tank is shown and described with reference to FIGS. 1A–2.

Figure 1A:
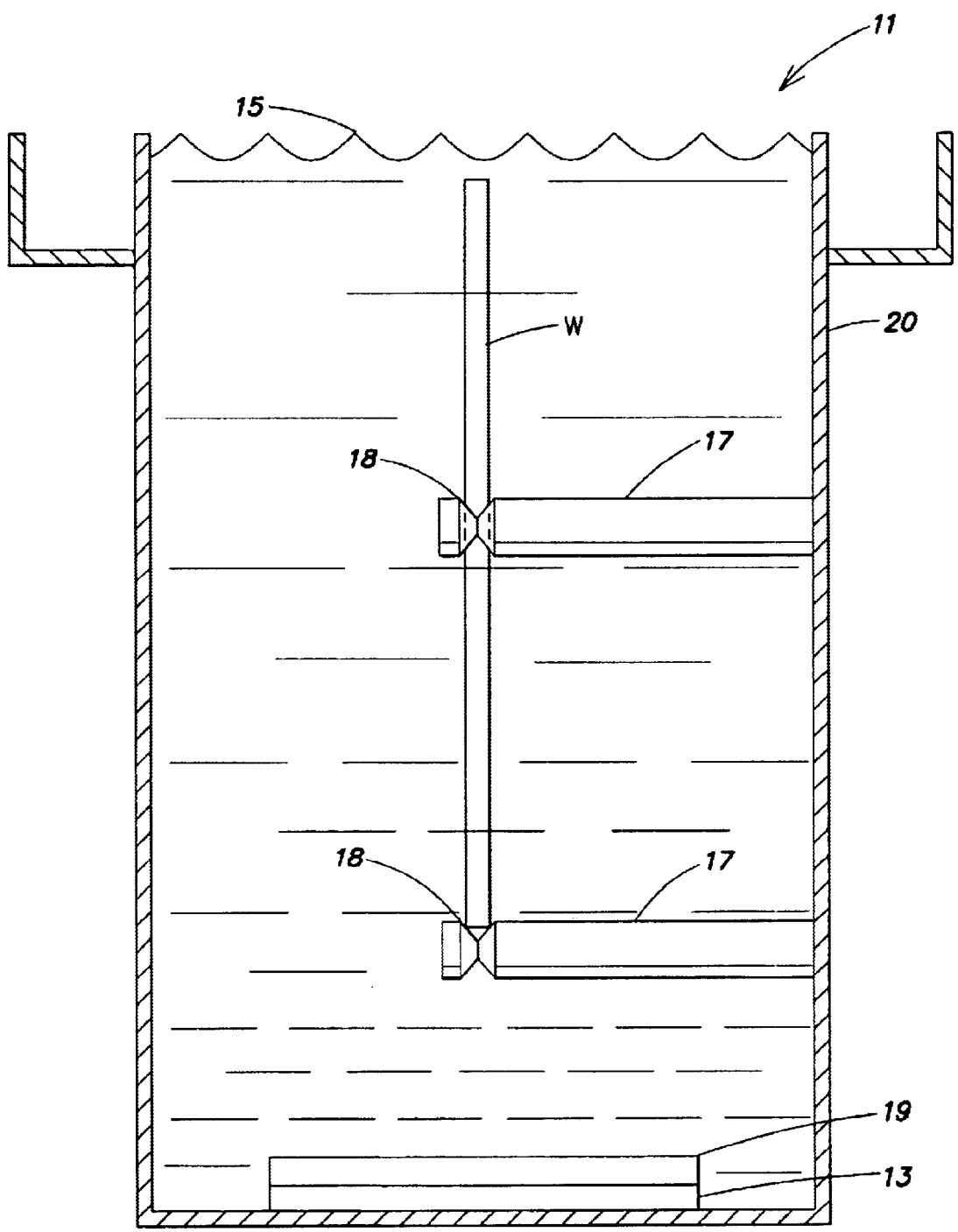
FIGS. 1A–B are a side view and a top plan view, respectively, of a conventional megasonic tank that comprises a fragile plate positioned along the bottom of the tank.
Figure 1B:
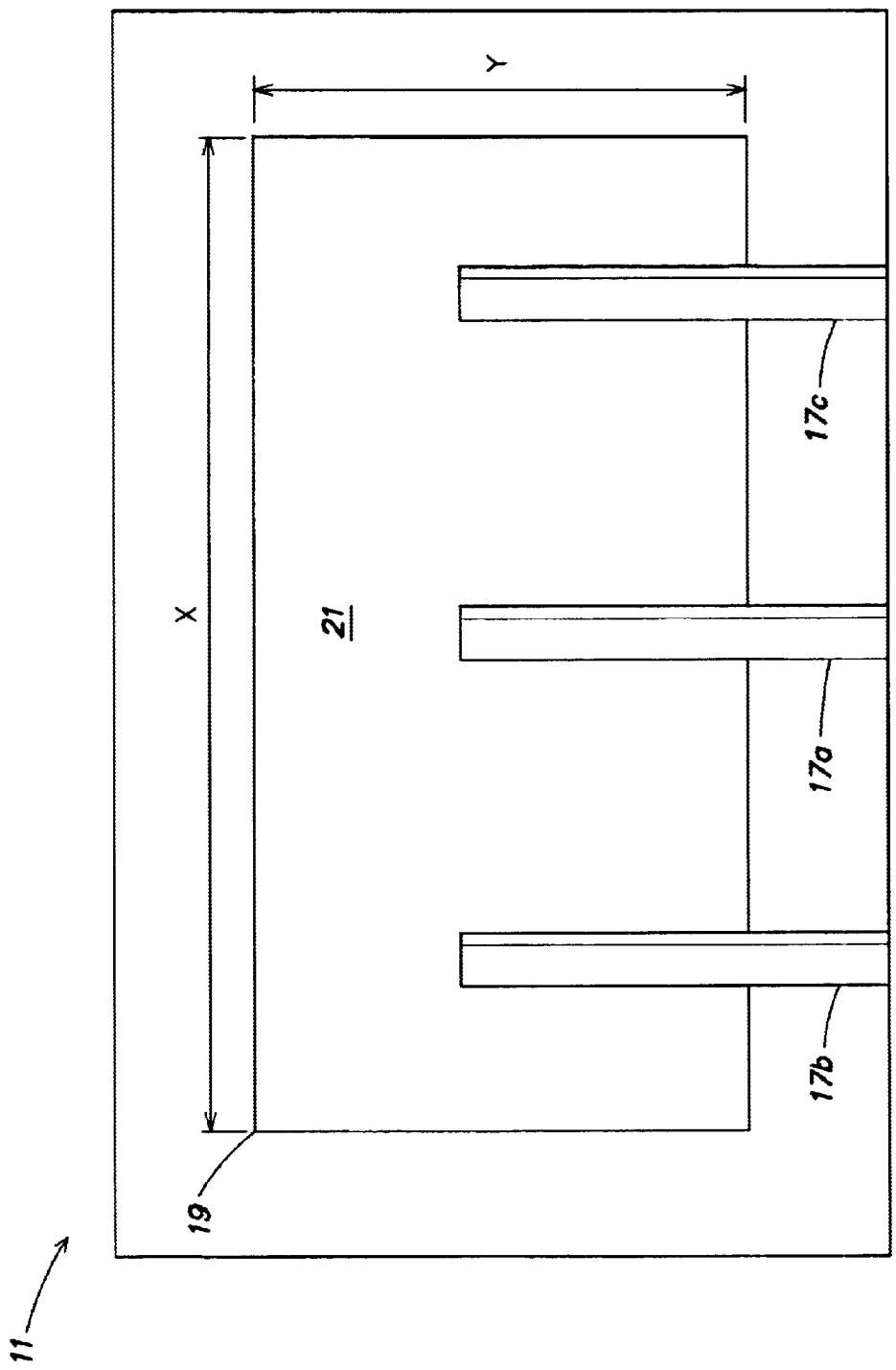

FIGS. 1A–B are a side view and a top plan view, respectively, of a conventional megasonic tank 11 that comprises a transducer 13 positioned along the bottom of the tank 11 and configured to direct sonic energy to a fluid 15 contained within the tank 11. The transducer 13 may be approximately equal in length to the diameter of the wafer W to be cleaned so as to clean a wafer W's entire diameter and may be significantly wider than the wafer W so as to clean the wafer's front and back surfaces. The conventional megasonic tank 11 may further comprise a fragile plate 19 (e.g., a quartz, ceramic or sapphire plate) configured to cover the transducer(s) 13 (e.g., so as to seal the transducer(s) 13 from the tank fluid 15 whether or not the transducer(s) are mounted inside the tank or outside the tank via a window) and configured to transmit energy output by the transducer. The fragile plate 19 may comprise a length X and a width Y, as shown. Note the tank 11 has an opening in the top thereof so as to allow a substrate to be inserted and extracted there through. The transducer 13 is positioned within the footprint of the opening.

Figure 2:
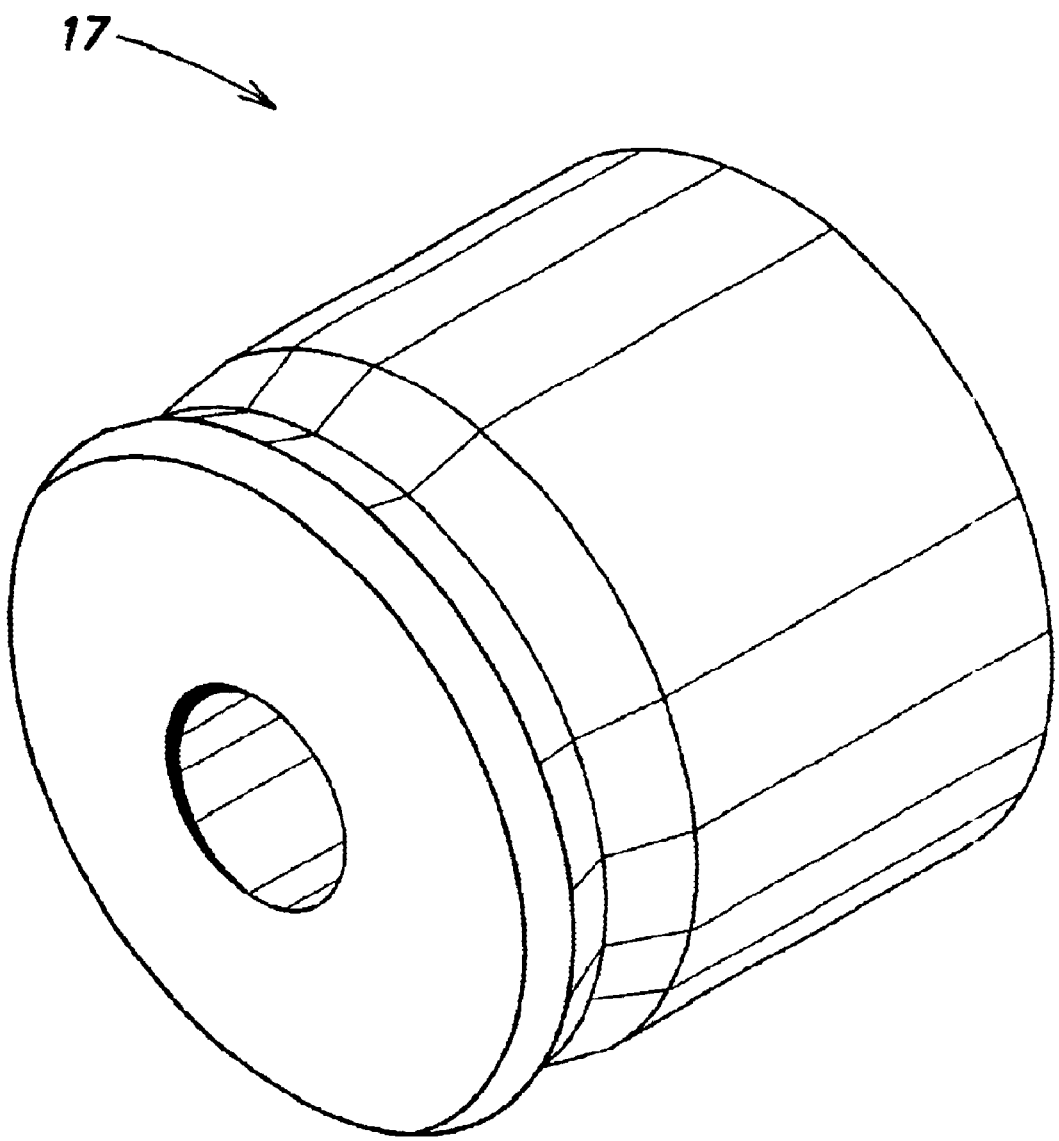
FIG. 2 is a front perspective view of the conventional roller of FIGS. 1A–B.

Above the fragile plate 19, a plurality of conventional rollers 17 are positioned to vertically support a wafer W in line with the transducer 13. FIG. 2 is a front perspective view of the conventional roller 17 of FIGS. 1A–B. In one aspect, the plurality of conventional rollers 17 may comprise a bottom roller 17a and a pair of side rollers 17b and 17c, configured to support and rotate the wafer W. The conventional rollers 17 may comprise a wafer supporting portion 18 (FIG. 1A) at one end that has a groove (e.g., a V-shaped groove) configured to support the wafer W. The conventional rollers 17 are coupled to a wall (e.g., the backwall 20 as shown in FIG. 1A) of the tank 11, and extend from the backwall 20 to approximately the middle of the fragile plate 19 so as to position the conventional roller 17's wafer supporting portion 18 above the middle of the fragile plate 19. Thus, the conventional rollers 17 partially cover the fragile plate 19.

Specifically, as shown in FIG. 1B, the conventional rollers 17 cover only one-half the width Y of fragile plate 19, thus exposing a major portion 21 of the fragile plate 19 wherein falling objects (e.g., hand tools, wafers, etc.) may miss the conventional rollers 17 and strike the fragile plate 19. The fragile plate 19's major portion 21 may comprise an area approximately equal to half the fragile plate 19's width Y and the entire fragile plate 19's length X. Thus, a falling object, such as a falling wafer, may impact the fragile plate 19's major portion 21 and may thereby break the fragile plate 19. Accordingly, the present inventors have developed an improved megasonic tank that may protect a fragile component such as the fragile plate 19 from impact by falling objects, as described further below with reference to FIGS. 3A–5.

Figure 3A:
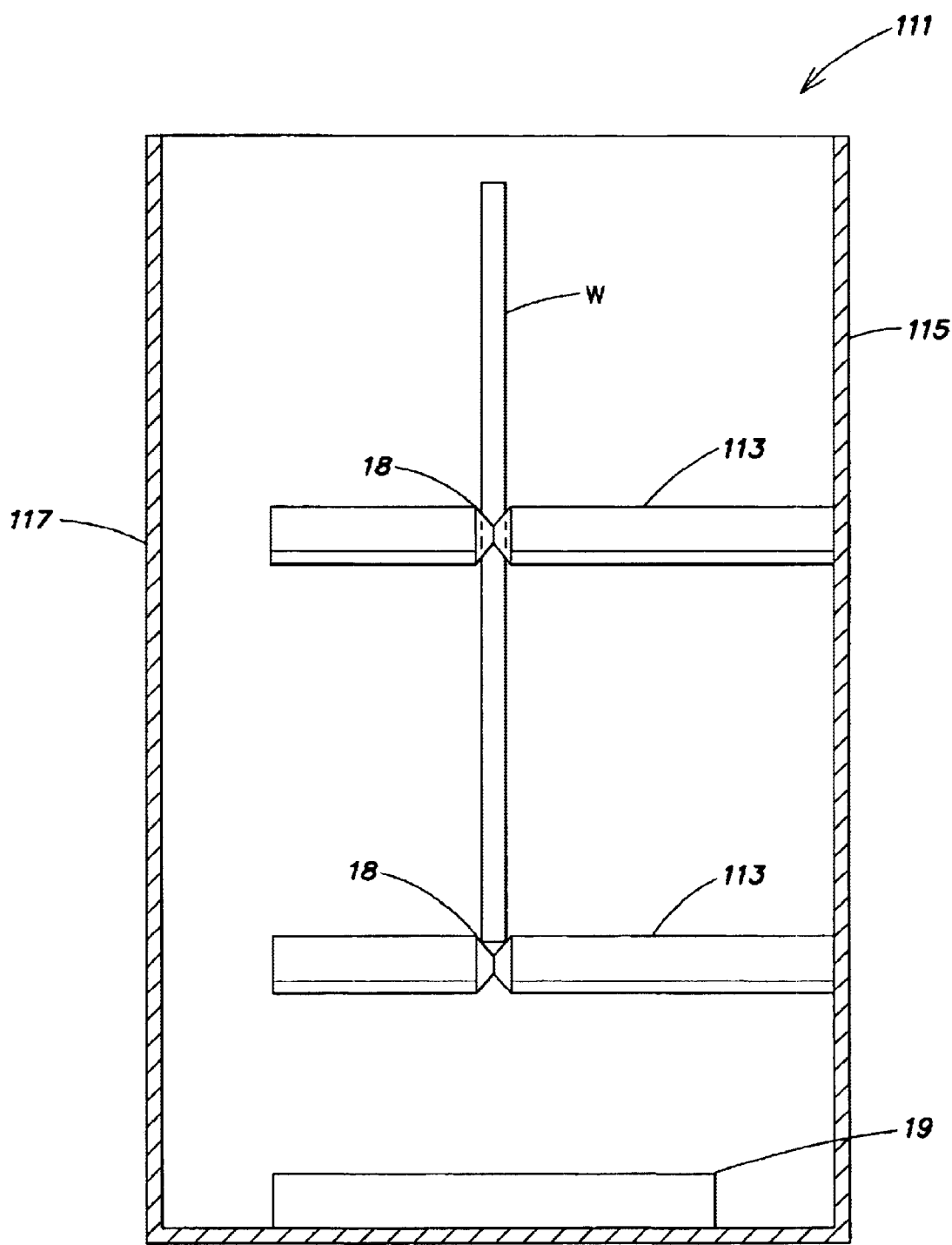
FIG. 3A is a schematic side elevational view of a first aspect of the invention that comprises a megasonic tank having an extended roller configured to protect the fragile plate from impact by falling objects.

FIG. 3A is a schematic side elevational view of an inventive megasonic tank 111 that may comprise the same components as the conventional megasonic tank 11 with the addition of a protective barrier configured to protect the fragile plate 19 from impact by falling objects. In this aspect, the protective barrier is an extended roller 113. The extended roller 113 is positioned above the fragile plate 19 and is coupled to a wall of the inventive megasonic tank 111 (e.g., the backwall 115 as shown in FIG. 3). The extended roller 113 extends from the backwall 115 and across the entire width Y of the fragile plate 19, in contrast to the conventional roller 17 of FIGS. 1A–B, which extends from the backwall 20 and across only one-half the width Y of the fragile plate 19.

Figure 3B:
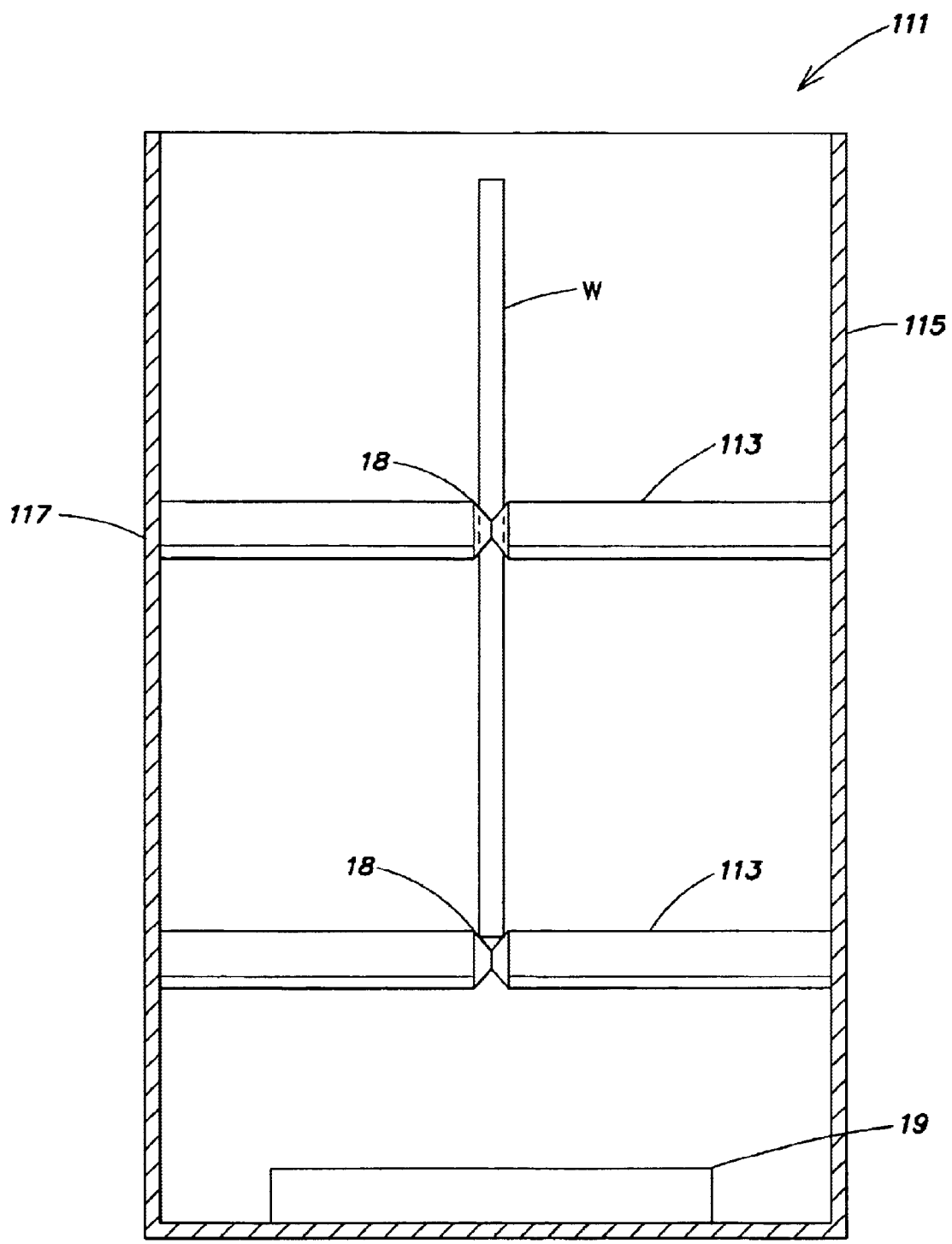
FIG. 3B is a schematic side elevational view of a second aspect of the invention that comprises a megasonic tank having an extended roller configured to protect the fragile plate from impact by falling objects.

In a further aspect as shown in FIG. 3B, the extended roller 113 extends to or nearly to the front wall 117 of the inventive megasonic tank 111 such that the extended roller 113 may more than cover the width Y of the fragile plate 19. It will be understood that in the aspects of FIGS. 3A–B, the extended roller 113 extends beyond the extended roller 113's wafer supporting portion 18, such that the extended roller's wafer supporting portion 18 remains positioned above the middle of the fragile plate 19 as is conventional.

The extended roller 113 may cover a greater area of the fragile plate 19 than does the conventional roller 17. Also, the length of the extended roller 113 may be equal to or greater than the width of the fragile plate 19.

The extended roller 113 may be hollow so that the extended roller 113 does not have significant additional weight relative to the weight of the conventional roller 17 (FIGS. 1A–2). In one aspect, the extended roller 113 may also be quartz such that energy waves (e.g., megasonic energy waves) produced by the transducer 13 travel through the extended roller 113. It will be understood that the quartz in the extended roller 113 is sufficiently thick such that a falling object may not break the extended roller 113 upon contact therewith.

The extended roller 113 may reduce the area of the fragile plate 19 on which falling objects may strike. Specifically, the extended roller 113 may extend the entire width of the fragile plate 19. Thus, the extended roller 113 may reduce the occurrence of quartz plate breakage due to falling objects, such as falling wafers. Also, the extended roller 113 may catch falling objects, thus the falling objects only travel a short distance prior to contact with a component in the inventive megasonic tank 111, which may reduce the occurrence of falling object breakage upon contact with the component.

Figure 4:
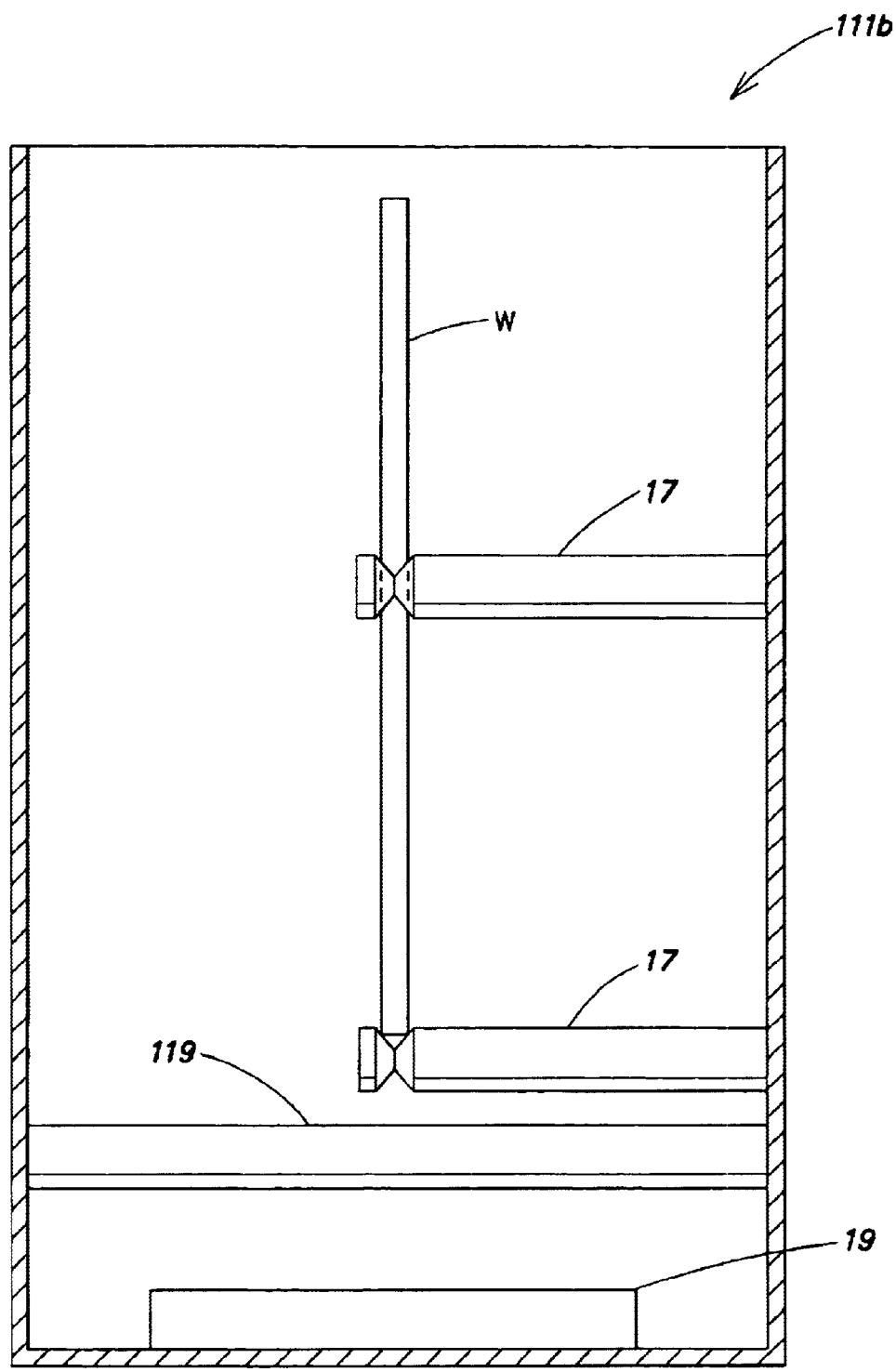
FIG. 4 is a schematic side elevational view of a third aspect of the invention that comprises a megasonic tank having a plurality of quartz bars configured to protect the fragile plate from impact by falling objects.
Figure 5:
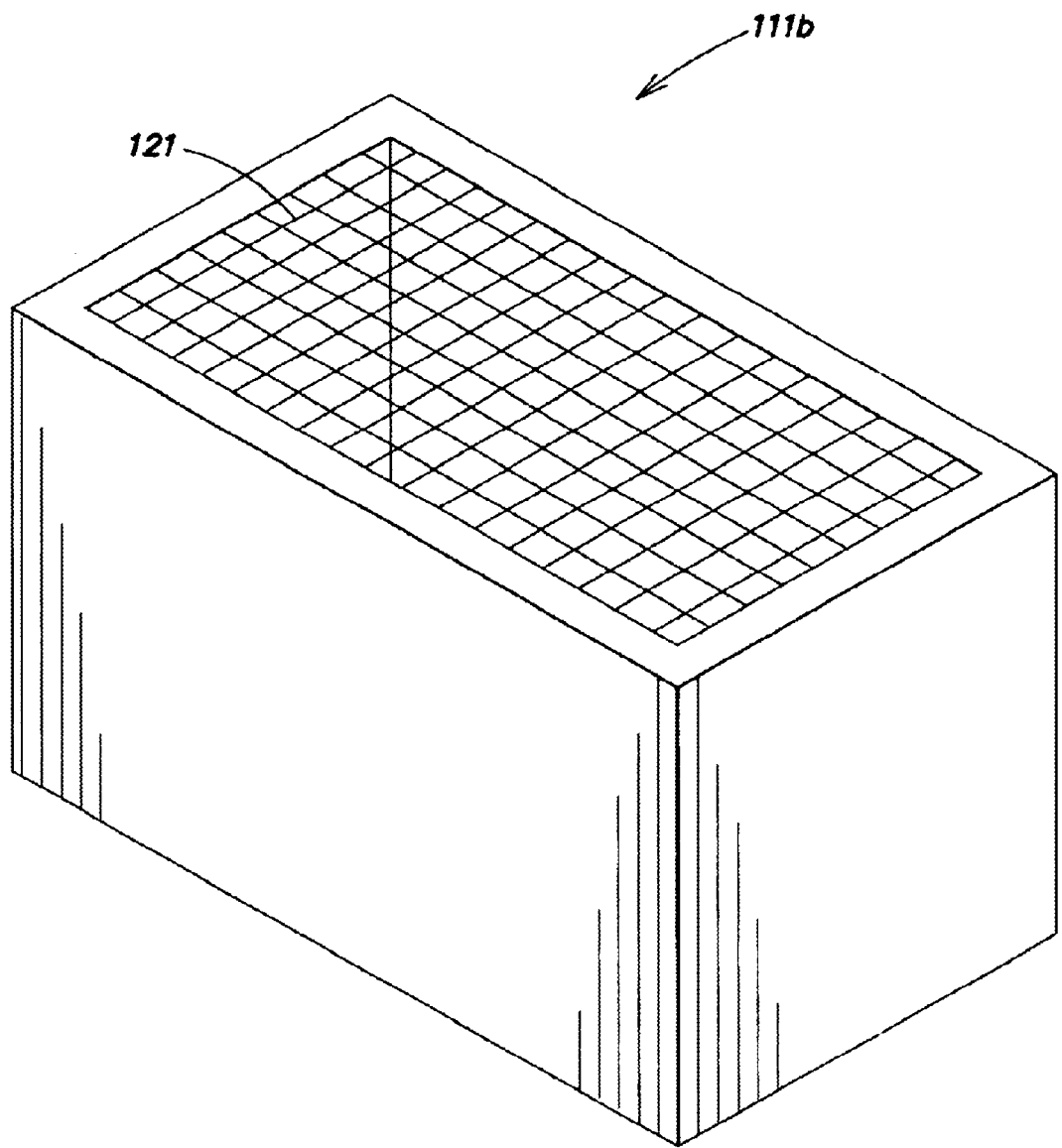
FIG. 5 is a schematic front perspective view of a fourth aspect of the invention that comprises a megasonic tank having a net configured to protect the fragile plate from impact by falling objects.

The foregoing description discloses only exemplary embodiments of the invention, modifications of the above-disclosed apparatus and method which fall within the scope of the invention will be readily apparent to those of ordinary skill in the art. For instance, in alternative aspects, an inventive megasonic tank 111b may comprise a plurality of quartz bars 119 that extend at or below the elevation of the conventional rollers 17 from one side of the inventive megasonic tank 111b to or nearly to the other side of the inventive megasonic tank 111b as shown in FIG. 4, or a net 121 that may be coupled to chamber walls and extend so as to catch falling objects as shown in FIG. 5. It will be understood that the quartz bars 119 and the net 121 are sufficiently thick such that a falling object may not break the quartz bars 119 or the net 121 upon contact therewith.

Further, as previously stated, the thickness of the bars and the extended rollers, etc., is chosen to be a multiple of one half the wavelength of sound output by the transducer as the sound travels through the bar and roller material; therefore the material will appear transparent to the acoustic energy. For example, assuming the transducer outputs one megahertz of acoustic power, a quartz bar or quartz extended roller may have about a 3 mm thickness.

Both the quartz bars 119 and the net 121 may protect other components of the inventive megasonic tank 111b in addition to the fragile plate 19. Further, in one aspect, the portion of the extended roller 113 which extends beyond the extended roller 113's wafer supporting portion 18, may be coupled, via a mechanism (e.g., screws, etc.) to the conventional rollers 17 making the conventional rollers 17 easy to retrofit. Finally, the fragile object may comprise objects other than a quartz plate (such as the transducer(s) itself, a sensor, etc.). It will be understood, however, that a lid and/or slideable door is not a barrier.

Accordingly, while the present invention has been disclosed in connection with the preferred embodiments thereof, it should be understood that other embodiments may fall within the spirit and scope of the invention, as defined by the following claims.

The invention claimed is:

1. An apparatus configured to clean a semiconductor substrate, comprising:
 a tank configured to contain a liquid, the tank having an opening configured to allow a substrate to enter the tank from a position above the tank;

a fragile component contained in the tank, positioned within the footprint of the opening, and configured to transmit sonic energy; and a barrier that extends above at least the width the fragile component;

wherein:
the fragile component comprises a quartz plate; and
the barrier comprises a substrate support, the substrate support comprises an extended roller, and the extended roller comprises a hollow extension.

2. The apparatus of claim 1 wherein the extended roller comprises quartz.

3. An apparatus configured to clean a semiconductor substrate, comprising:
a tank configured to contain a liquid, the tank having an opening configured to allow a substrate to enter the tank from a position above the tank;
a fragile component contained in the tank, positioned within the footprint of the opening, and configured to transmit sonic energy; and
a barrier that extends above at least the width the fragile component;
wherein the barrier is configured so as to be transparent to the sonic energy transmitted by the fragile component.

4. An apparatus configured to clean a semiconductor substrate, comprising:
a tank configured to contain a liquid, the tank having an opening configured to allow a substrate to enter the tank from a position above the tank;
a fragile component contained in the tank, positioned within the footprint of the opening, and configured to transmit sonic energy; and
a barrier extending above at least the width the fragile component;
wherein the barrier has a thickness that is a multiple of one half of the wavelength of the sonic energy transmitted by the fragile component as the sonic energy travels through the barrier material.

5. An apparatus configured to clean a semiconductor substrate, comprising:
a tank configured to contain a liquid, the tank having an opening configured to allow a substrate to enter the tank from a position above the tank;
a fragile component contained in the tank positioned within the footprint of the opening and configured to transmit sonic energy; and
a barrier that extends above at least the width of the fragile component and is positioned so as to protect a central region of the length of the fragile component;
wherein the barrier comprises at least three substrate support rollers, and is configured so as to be transparent to the sonic energy transmitted by the fragile component.

6. An apparatus configured to clean a semiconductor substrate, comprising:
a tank configured to contain a liquid, the tank having an opening configured to allow a substrate to enter the tank from a position above the tank;
a fragile component contained in the tank, positioned within the footprint of the opening and configured to transmit sonic energy; and
a barrier that extends above at least the width of the fragile component and is positioned so as to protect a central region of the length of the fragile component;
wherein the barrier comprises at least three substrate support rollers, and has a thickness that is a multiple of one half of the wavelength of the sonic energy transmitted by the fragile component as the sonic energy travels through the barrier material.

7. An apparatus configured to clean a semiconductor substrate, comprising:
a tank configured to contain a liquid, the tank having an opening configured to allow a substrate to enter the tank from a position above the tank;
a fragile component contained in the tank, positioned within the footprint of the opening and configured to transmit sonic energy; and
a barrier that extends above at least the width of the fragile component and is positioned so as to protect a central region of the length of the fragile component;
wherein the barrier comprises a substrate support, the substrate support comprises an extended roller, the extended roller is a bottom roller positioned so as to contact a bottom region of a substrate supported thereby, and the barrier is configured so as to be transparent to the sonic energy transmitted by the fragile component.

8. An apparatus configured to clean a semiconductor substrate, comprising:
a tank configured to contain a liquid the tank having an opening configured to allow a substrate to enter the tank from a position above the tank;
a fragile component contained in the tank, positioned within the footprint of the opening and configured to transmit sonic energy; and
a barrier that extends above at least the width of the fragile component and is positioned so as to protect a central region of the length of the fragile component;
wherein the barrier comprises a substrate support, the substrate support comprises an extended roller, the extended roller is a bottom roller positioned so as to contact a bottom region of a substrate supported thereby, and the barrier has a thickness that is a multiple of one half of the wavelength of the sonic energy transmitted by the fragile component as the sonic energy travels through the barrier material.

9. An apparatus configured to clean a semiconductor substrate, comprising:
a tank configured to contain a liquid, the tank having an opening configured to allow a substrate to enter the tank from a position above the tank;
a fragile component contained in the tank, positioned within the footprint of the opening, and configured to transmit sonic energy; and
a barrier that extends above at least the width of the fragile component;
wherein the barrier comprises a substrate support, the substrate support comprises an extended roller, the extended roller is a bottom roller positioned so as to contact a bottom region of a substrate supported thereby, and the barrier is configured so as to be transparent to the sonic energy transmitted by the fragile component.

10. An apparatus configured to clean a semiconductor substrate, comprising:
a tank configured to contain a liquid, the tank having an opening configured to allow a substrate to enter the tank from a position above the tank;
a fragile component contained in the tank, positioned within the footprint of the opening, and configured to transmit sonic energy; and a barrier that extends above at least the width of the fragile component;

wherein the barrier comprises a substrate support, the substrate support comprises an extended roller, the extended roller is a bottom roller positioned so as to contact a bottom region of a substrate supported thereby, and the barrier has a thickness that is a multiple of one half of the wavelength of the sonic energy transmitted by the fragile component as the sonic energy travels through the barrier material.

* * * * *